United States Patent
Sugimae et al.

(10) Patent No.: US 7,151,686 B2
(45) Date of Patent: Dec. 19, 2006

(54) SEMICONDUCTOR MEMORY DEVICE AND ELECTRIC DEVICE WITH THE SAME

(75) Inventors: Kikuko Sugimae, Yokohama (JP); Takuya Futatsuyama, Yokohama (JP); Riichiro Shirota, Fujisawa (JP); Masayuki Ichige, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 48 days.

(21) Appl. No.: 10/944,910

(22) Filed: Sep. 21, 2004

(65) Prior Publication Data

US 2005/0105335 A1    May 19, 2005

(30) Foreign Application Priority Data

Sep. 25, 2003  (JP) .............................. 2003-333487

(51) Int. Cl.
   *G11C 17/00*  (2006.01)
(52) U.S. Cl. .................................. 365/100; 365/230.06
(58) Field of Classification Search ................ 365/100, 365/230.06
   See application file for complete search history.

(56) References Cited

U.S. PATENT DOCUMENTS

| | | | |
|---|---|---|---|
| 5,517,457 A | | 5/1996 | Sakui et al. |
| 6,337,807 B1 * | | 1/2002 | Futatsuyama et al. . 365/185.17 |
| 6,459,612 B1 * | | 10/2002 | Satoh et al. ........... 365/185.03 |
| 6,720,612 B1 | | 4/2004 | Takeuchi et al. |
| 6,781,895 B1 * | | 8/2004 | Tanaka et al. ............... 365/200 |
| 6,839,283 B1 * | | 1/2005 | Futatsuyama et al. . 365/185.23 |
| 6,967,892 B1 * | | 11/2005 | Tanaka et al. ......... 365/230.06 |
| 2004/0089717 A1 * | | 5/2004 | Harari et al. ................ 235/441 |

FOREIGN PATENT DOCUMENTS

| | | |
|---|---|---|
| JP | 2000-76880 | 3/2000 |
| KR | 2002-0023501 | 3/2002 |

OTHER PUBLICATIONS

Patent Abstracts of Japan, JP 2002-280463, Sep. 27, 2002 (with corr. US 6,720,612).

* cited by examiner

*Primary Examiner*—Michael Tran
(74) *Attorney, Agent, or Firm*—Oblon, Spivak, McClelland, Maier & Neustadt, P.C.

(57) ABSTRACT

A semiconductor memory device having: a cell array including bit lines, word lines and memory cells disposed at crossings thereof, plural memory cells being connected in series to constitute a NAND cell unit, plural blocks being arranged, each being constituted by plural NAND cell units arranged in the word line direction; and a row decoder configured to select a block, wherein the row decoder includes: transferring transistor arrays disposed in association with the blocks, in each of which transistors are arranged for transferring word line drive voltages; first decode portions disposed in association with the transferring transistor arrays, which are applied with boosted voltages to selectively drive the transferring transistor arrays; and second decode portions configured to select one of the blocks, each of which is disposed to be shared by adjacent two first decode portions.

20 Claims, 14 Drawing Sheets

SEMICONDUCTOR MEMORY DEVICE AND ELECTRIC DEVICE WITH THE SAME

CROSS-REFERENCE TO RELATED APPLICATION

This application is based on and claims the benefit of priority from the prior Japanese Patent Application No. 2003-333487, filed on Sep. 25, 2003, the entire contents of which are incorporated herein by reference.

BACKGROUND OF THE INVENTION

1. Field of the Invention

This invention relates to a semiconductor memory device and an electric device with the same.

2. Description of Related Art

Conventionally, various types of electrically rewritable and non-volatile semiconductor memory devices (EEPROMs) are known. Especially, a NAND-type EEPROM is known as one with a high integration level, in which plural memory cell are connected in series to constitute a NAND cell unit in such a manner that adjacent two memory cells share a source/drain layer. Usually, a MOS transistor, which has a charge storage layer (floating gate) and a control gate stacked on a semiconductor substrate, serves as a memory cell in the NAND-type EEPROM. This memory cell stores data in a non-volatile manner, which is defined by an amount of charge stored in the floating gate.

One end on a NAND cell unit is coupled to a bit line via a select gate transistor; and the other end to a source line via another select gate transistor. Control gates of the memory cells are coupled to different word lines, which are disposed as extending in a direction. A set of memory cells arranged along a word line constitutes a page (or two pages), which serves as a unit of data read and data write. A set of NAND cell units arranged along a word line (usually including 16 or 32 word lines) constitutes a block (or cell block), which serves as a unit of data erase. Usually, one cell array plane has plural blocks arranged in the bit line direction.

Disposed at one end of the bit lines is a sense amplifier circuit with a data latch, which serves as a page buffer; and disposed at one end of the word lines is a row decoder, which selects and drives a block and a word line. The cell array, page buffer and row decoder constitute a memory core. In a peripheral area of the memory core, there are disposed a high voltage generation circuit for generating various high voltages used for write, erase and read operations, a fuse circuit used for selecting redundant circuits, and a controller for controlling write and erase sequences and a read operation.

The cell array of the NAND-type EEPROM may be easily miniaturized because it is formed with a periodical pattern. However, it is required of transferring transistors, which are disposed in the row decoder to be coupled to word lines in the cell array, to be formed of high-voltage transistors (i.e., transistors subjected to a boosted voltage) with a channel length larger than that of the memory cells. By reason of this, it is impossible to dispose the transferring transistors at a word line pitch. To solve this problem, there have already been provided methods, in which the transferring transistors are dispersedly disposed at both ends of the word lines in the cell array (see, for example, JP7-230696A and JP2003-076880A).

In detail, the row decoder dispersing methods are classified into three types as follows: first, transferring transistors are disposed alternately on the right and left sides of the cell array for every word line; second, transferring transistors are disposed alternately on the right and left sides of the cell array for every block; third, transferring transistors are disposed alternately on the right and left sides of the cell array for every two blocks.

In the first scheme, give attention to a NAND cell unit disposed at end portion of a word line, further give attention to adjacent two word lines, and there is generated a difference between driving timings of two memory cells in the NAND cell unit controlled by the two word lines because driving ends of the two word lines are different. There is no driving timing problem in the second and third schemes because the driving ends of the entire word lines in a block are located on the same side.

Another problem of the dispersed transferring transistors is in the word line drawing wiring regions. It is required of word line drawing regions, which are defined for extending the word lines of the cell array to couple those to diffusion layers of the transferring transistors, to be changed in the line pitch for expanding the word line pitch. Therefore, the periodicity of line/space of the word lines is broken outside of the cell array, and this leads to difficulty of exposure. In consideration of this point, it is necessary for arranging the word line drawing portions. This causes the memory chip to be increased in area.

SUMMARY OF THE INVENTION

According to an aspect of the present invention, there is provided a semiconductor memory device having:

a cell array including bit lines and word lines disposed to cross each other, and electrically rewritable and non-volatile memory cells disposed at crossings of the bit lines and word lines, plural memory cells being connected in series to constitute a NAND cell unit, plural blocks being arranged in the bit line direction, each block being constituted by plural NAND cell units arranged in the word line direction; and a row decoder configured to select a block of the cell array, wherein the row decoder includes:

transferring transistor arrays disposed in association with the blocks, in each of which transistors are arranged for transferring word line drive voltages;

first decode portions disposed in association with the transferring transistor arrays, which are applied with boosted voltages to selectively drive the transferring transistor arrays; and second decode portions configured to select one of the blocks, each of which is disposed to be shared by adjacent two first decode portions.

DETAILED DESCRIPTION OF THE EMBODIMENTS

Illustrative embodiments of this invention will be explained with reference to the accompanying drawings below.

Embodiment 1

Figure 1:
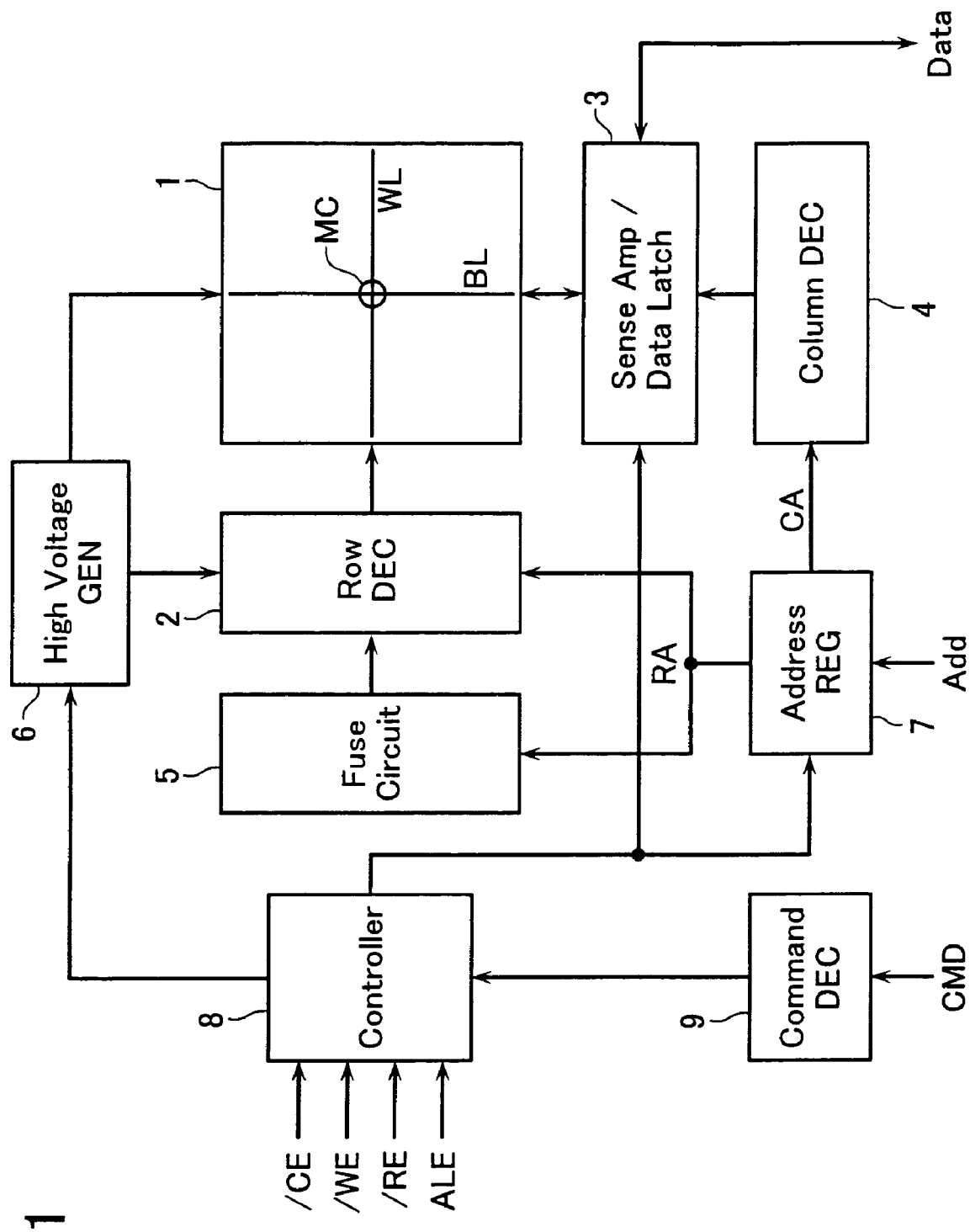
FIG. 1 shows a functional block configuration of a NAND-type flash memory in accordance with an embodiment of the present invention.

FIG. 1 shows a functional block of a NAND-type EEPROM (flash memory) in accordance with an embodiment 1. A cell array 1 has plural word lines, WL, and plural bit lines, BL, which are disposed as crossing each other, and electrically rewritable and non-volatile memory cells, MC, disposed at the respective crossings of the word lines and bit lines. The cell array 1 is NAND-type one, in which plural blocks are arranged as described later in detail.

A row decoder 2 decodes row address "RA" to select and drive a block and a word line WL therein. A sense amplifier circuit 3 has a function of sensing bit line data and serves as a data latch. In detail, the sense amplifier circuit 3 serves as a page buffer for sensing/latching data of a page. A column decoder 4 decodes column address "CA" to select the bit lines. External address "Add" is input to an address register 7, and row address, RA, and column address, CA, therein are transferred to the row decoder 2 and column decoder 4, respectively.

To generate various high voltages used in data write, erase and read modes, a high voltage generating circuit 6 is disposed. Supplied to a controller 7 are chip enable signal /CE, write enable signal /WE, read enable signal /RE, address latch enable signal ALE and command CMD, which is decoded in a command decoder 7. In response to these control signals and command, the controller 8 controls the high voltage generation circuit 6 in accordance with operation modes, and controls write and erase sequences and a read operation. A fuse circuit 5 stores defective addresses for replacing defective cells with redundant cells. Although a detailed explanation is omitted, the fuse circuit 5 is so programmed as to replace a block including a defective word line in the cell array 1 with a redundant block.

Figure 2:
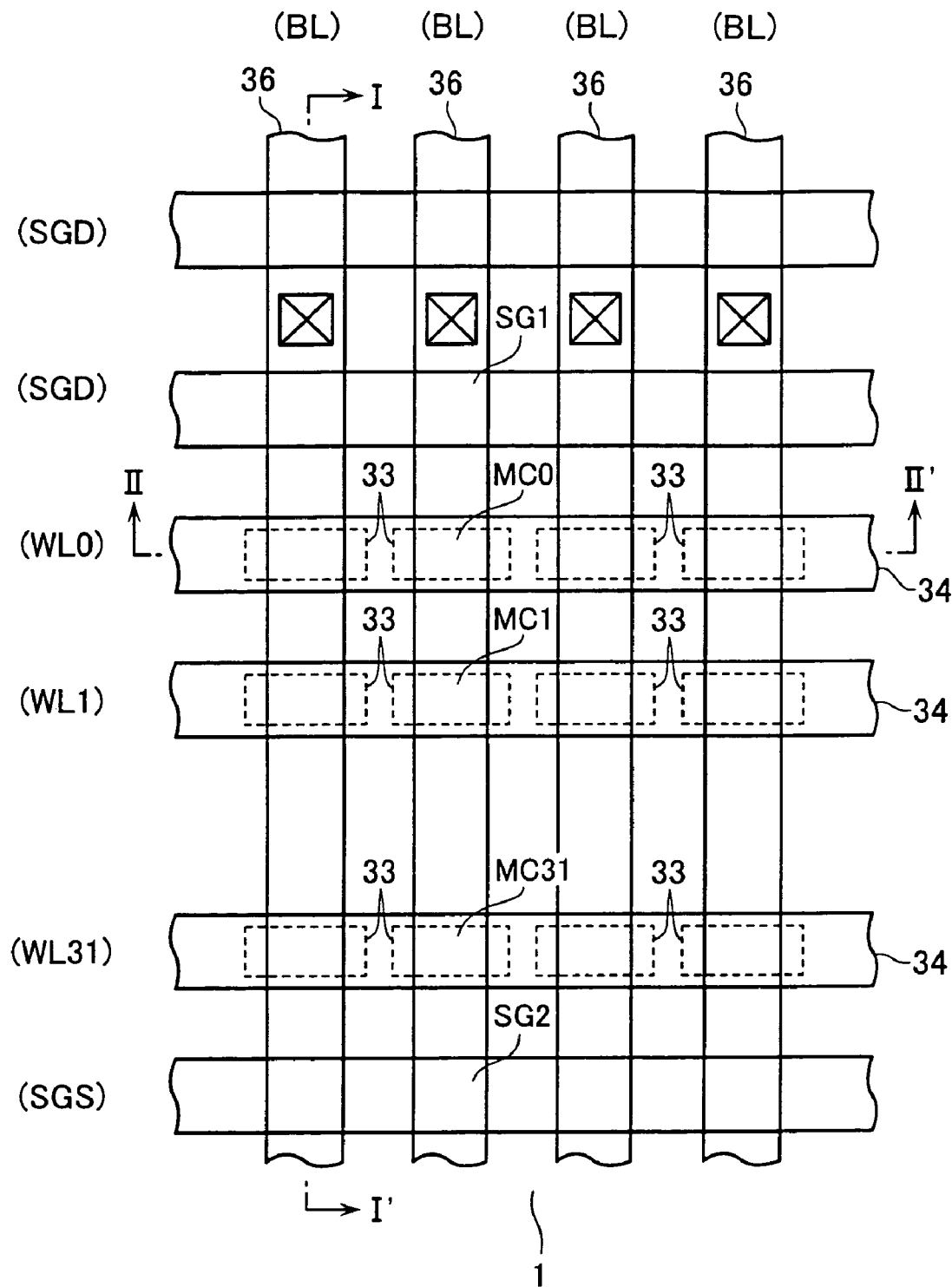
FIG. 2 is a plan view of a cell array of the flash memory.
Figure 3:
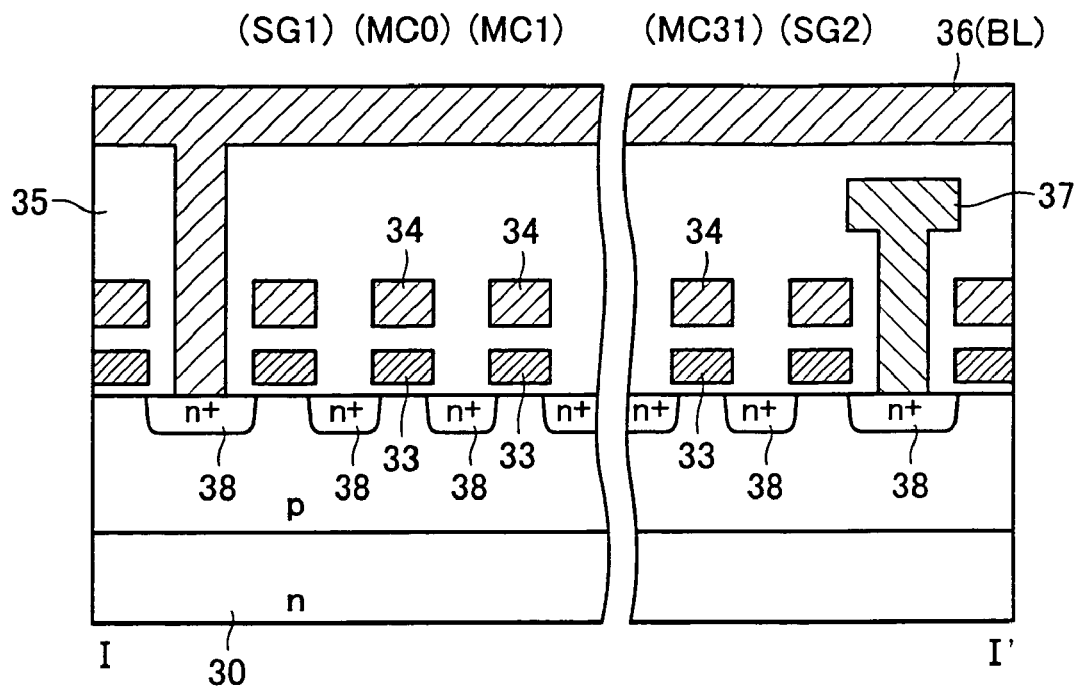
FIG. 3 is a sectional view of the cell array taken along line I–I' of FIG. 2.
Figure 4:
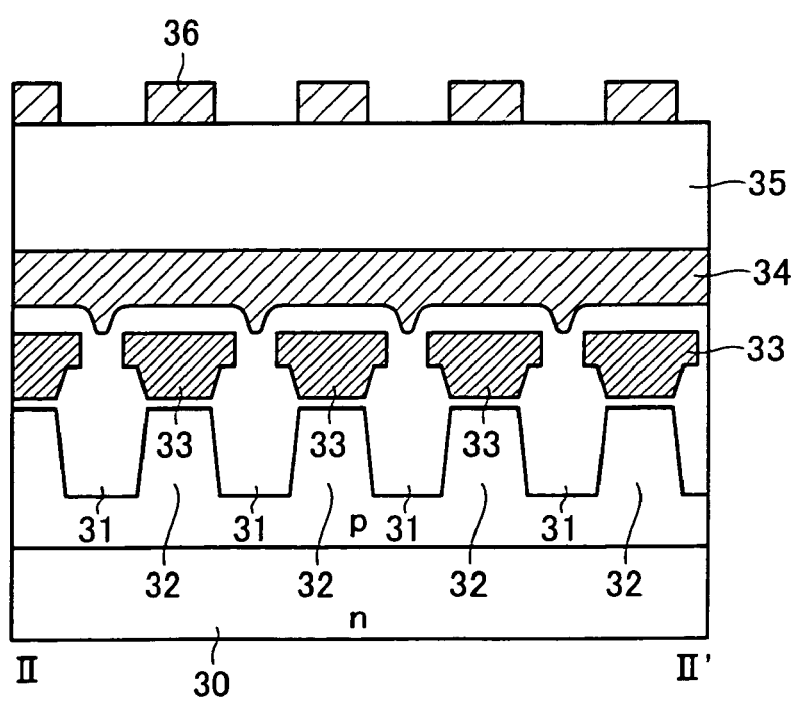
FIG. 4 is a sectional view of the cell array taken along line II–II' of FIG. 2.

FIG. 2 shows a layout of the cell array 1, and FIGS. 3 and 4 show sectional views taken along lines I–I' and II–II' in FIG. 2. In the cell array forming area of a silicon substrate 30, a p-type well is formed. In this p-type well, stripe-shaped device formation regions 32 are defined by a device isolation insulating film 31 and arranged at a certain pitch. Polysilicon floating gates 33 are formed on each device formation region with tunnel insulating films interposed therebetween; polysilicon control gates 34 are formed on the floating gates 33 with interlayer insulating films interposed therebetween; and source/drain diffusion layers 38 are formed as being self-aligned with the control gates, thereby constituting memory cells MC (MC0–MC31). As adjacent two memory cells share a source/drain layer 38, plural memory cells constitute a NAND cell unit. Select gate transistors SG1 and SG2 are disposed both ends of a NAND cell unit.

Control gates 34 are, as shown in FIGS. 2 and 4, patterned to extend in a direction and serve as word lines WL. An interlayer insulating film 35 is formed to cover the cell array, and bit lines (BL) 36 are formed thereon. The bit line 36 is contacted to a diffusion layer of a select gate transistor located on the drain side of the NAND cell unit. A common source line (SL) 37, which is contacted to a diffusion layer of another select gate transistor located on the source side of the NAND cell unit, is buried in the interlayer insulating film 35.

Figure 5:
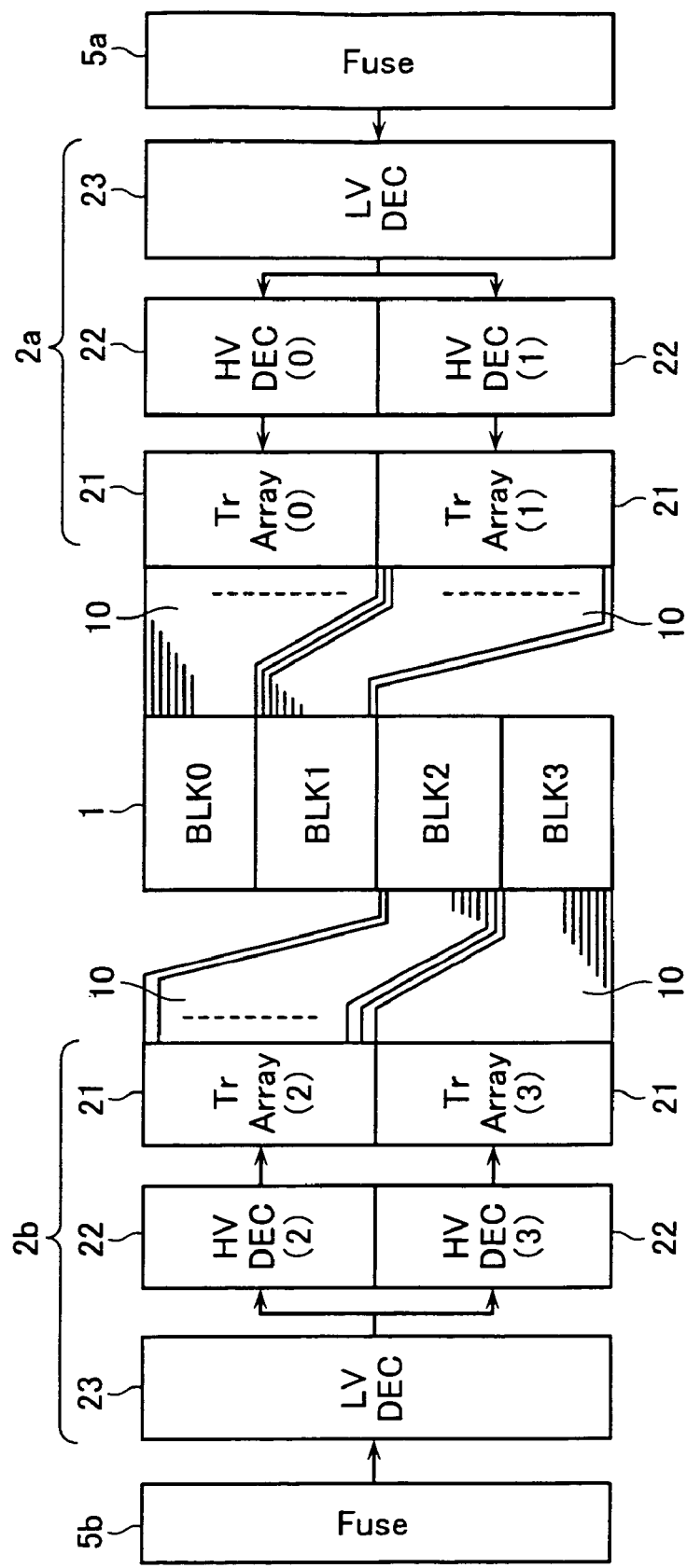
FIG. 5 shows a layout of the cell array and row decoder in the flash memory.

FIG. 5 shows a schematic layout of the cell array 1, row decoder 2 and fuse circuit 5 on the memory chip, which are shown as functional blocks in FIG. 1. As described above, the cell array 1 has plural blocks arranged in the bit line direction. In the example shown in FIG. 5, four blocks BLK0–BLK3 are arranged. With respect to these blocks, two row decoders 2(2a, 3b) are dispersedly disposed on both sides of the cell array 1 in the word line direction. That is, a row decoder 2a is disposed on the right side of the cell array 1 for selecting upper two blocks BLK0 and BLK1, which are adjacent to each other; and another row decoder 2b on the left side of the cell array 1 for selecting lower two blocks BLK2 and BLK3, which are adjacent to each other. It should be noted that in case there are disposed more blocks, row decoders are dispersedly disposed alternately for every two blocks as well as above-described example.

The row decoder 2a has transferring transistor arrays 21 disposed in association with the blocks BLK0 and BLK1, in each of which high-voltage transistors are arranged for transferring drive voltages used for driving word lines and select gate lines; two high voltage decode portions (VH-DEC) 22 disposed to drive the transistor arrays 21, respectively; and a low voltage decode portion (LV-DEC) 23 disposed as shared by two high voltage decode portions for selecting one of the two blocks BLK0 and BLK1. As similar to this, the row decider 2b has transferring transistor arrays 21 disposed in association with the blocks BLK2 and BLK3, in each of which high-voltage transistors are arranged for transferring drive voltages used for driving word lines and select gate lines; two high voltage decode portions (VH-DEC) 22 disposed to drive the transistor arrays 21, respectively; and a low voltage decode portion (LV-DEC) 23 disposed as shared by two high voltage decode portions for selecting one of the two blocks BLK2 and BLK3.

Note here, in this specification, a decode circuit portion, which is applied with boosted voltages higher than a power supply voltage, is defined as a "high voltage decode portion"; and another decode circuit portion, which is applied with voltages lower than those in the high voltage decode portion, as a "low voltage decode portion".

Since the row decoders 2a and 2b, which are correlated with adjacent two blocks, are dispersedly disposed on the right and left sides of the cell array, it becomes possible to dispose the transferring transistor arrays 21, each of which requires a space wider than a block width, for every block. Drawing wiring regions 10 are disposed for drawing and coupling the word lines in the blocks to the transistor arrays 21 in the row decoders 2a, 2b. Drawing wirings in each drawing wiring region 10 are formed with wiring pitch change for enlarging the word line pitch in the block.

As described above, in this embodiment, two high voltage decode portions 22, which are correlated to two blocks BLK0 and BLK1 respectively, share one low voltage decode portion 23. As well as this, two high voltage decode portions 22, which are correlated to two blocks BLK2 and BLK2 respectively, share another low voltage decode portion 23. As a result of that each of the row decoders 2a and 2b is formed to have a common decode circuit portion, it becomes possible to suppress the chip area increasing due to the drawing wiring region 10 with wiring pitch change.

Figure 6:
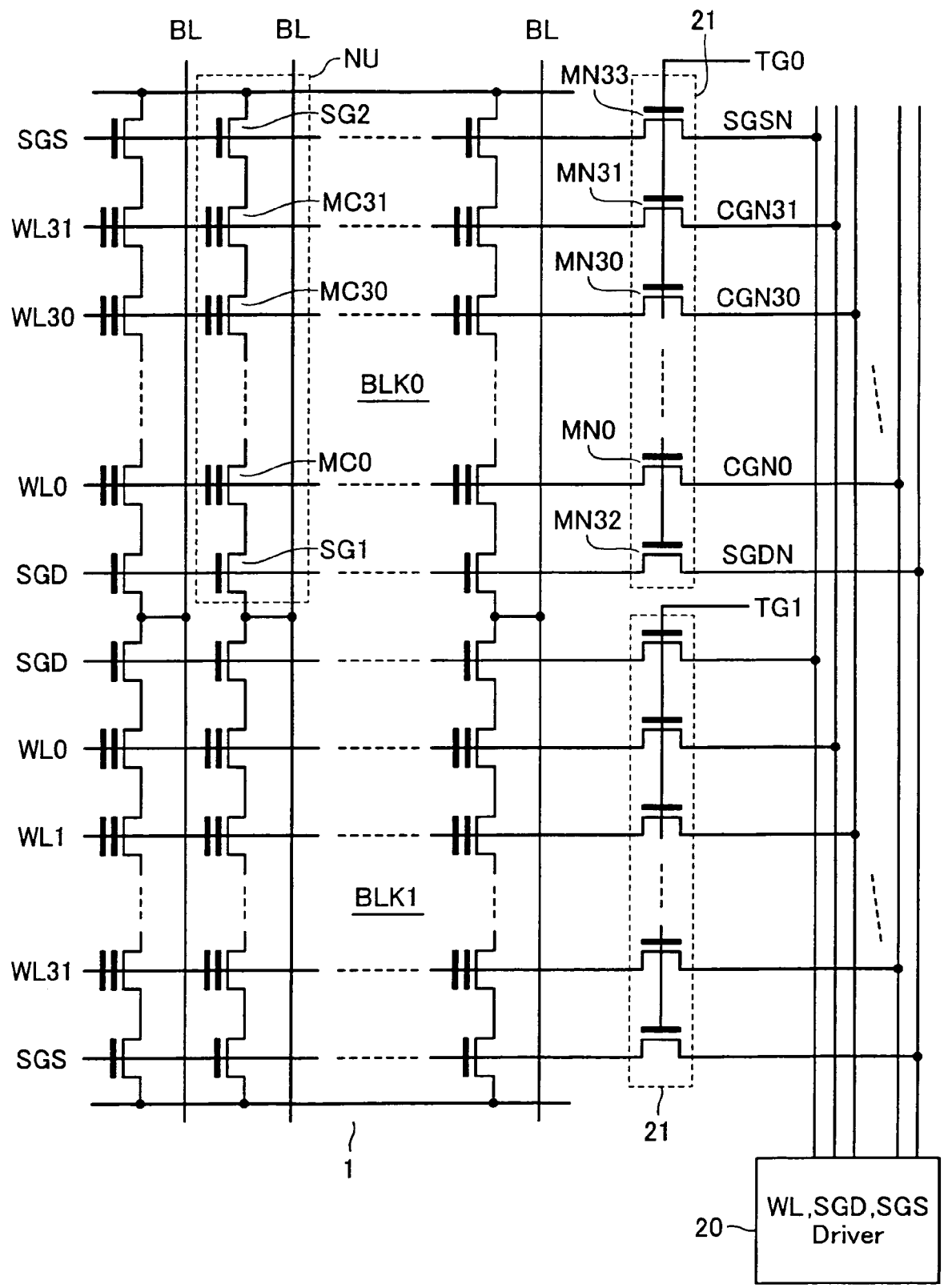
FIG. 6 shows an equivalent circuit of the cell array.

FIG. 6 shows an equivalent circuit of the cell array 1 and transistor array 21 connected to the word lines and select gate lines thereof with respect to adjacent two blocks BLK0 and BLK1. The NAND cell unit NU in this example has thirty two memory cells MC0–MC31 connected in series. One end of these memory cells MC0–MC31 is coupled to a bit line BL via a select gate transistor SG1, and the other end to a common source line SL via another select gate transistor SG2.

Control gates of the memory cells MC0–MC31 are coupled to word lines WL0–WL31, which cross the bit line BL to be continued. Gates of the select gate transistors SG1, SG2 are coupled to select gate lines SGD, SGS, respectively, which are disposed in parallel with the word lines. NMOS transistors NM0–MN31, MN32 and MN33 are disposed to be connected to the word lines WL0–WL31, and select gate lines SGD and SGS, and these constitute the transfer transistor array 21, which is driven by the output of the row decoder to transfer various word line drive voltages.

Gates of the transistors MN0–MN33 constituting each transferring transistor array 21 are connected in common for every block. These common gates TG0 and TG1 are driven by the row decoder outputs. With respect to a selected block in write or read mode, these transferring transistors MN0–MN33 become on. Supplied to source/drain nodes CG0–CG31, SGDN and SGSN of these transistors MN0–MN33 are various word line drive voltages output from a word line driver circuit 20, which is shared by the entire blocks and included in a row decoder in a broad sense, in accordance with operation modes such as write voltage Vpgm, write pass voltage Vpass, read pass voltage Vread and the like, or ground potential. These voltages are supplied to word lines and select gate lines in a selected block via a transistor array 21 selected in the row decoder 2.

Figure 7:
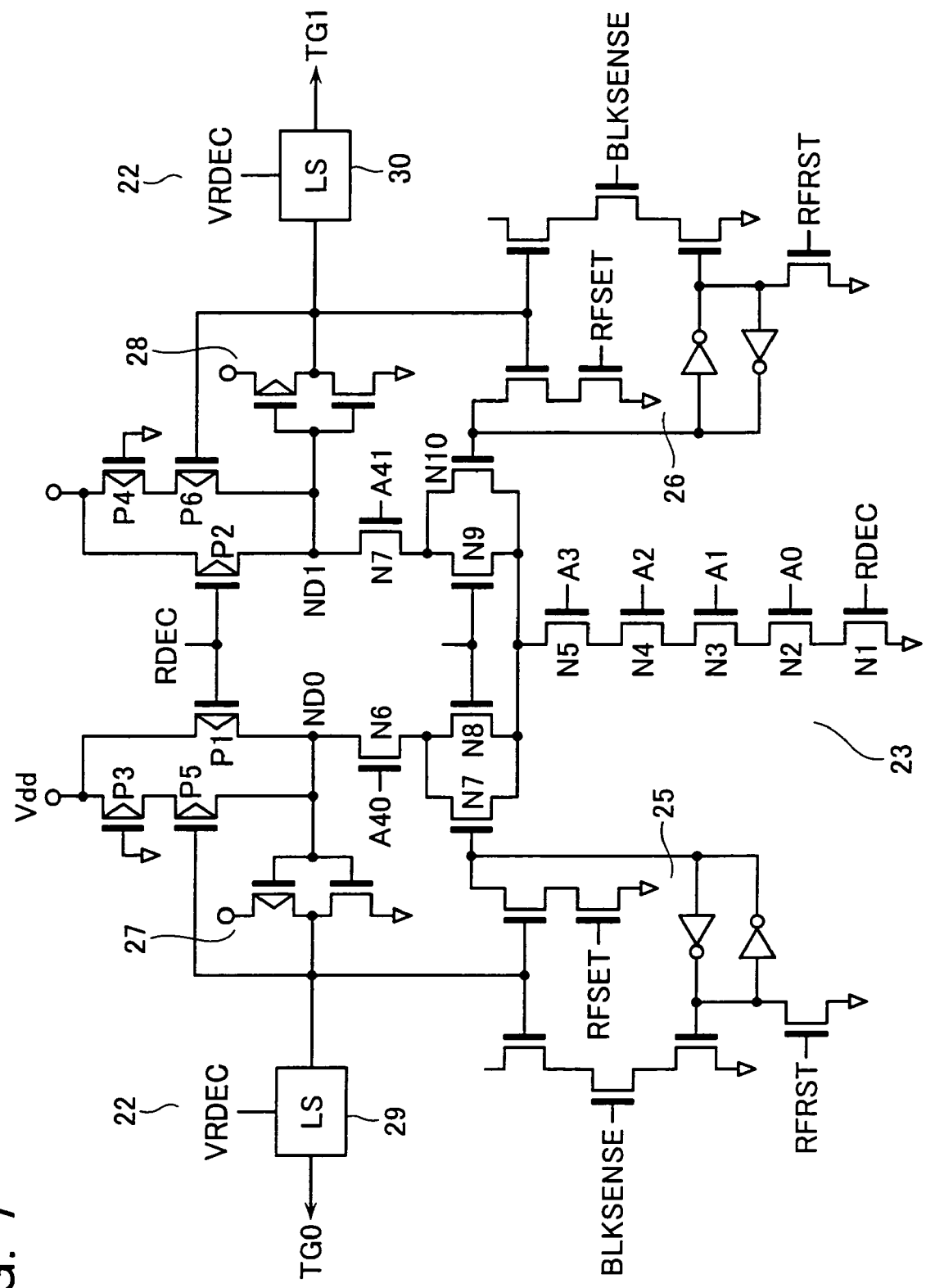
FIG. 7 shows an equivalent circuit of high voltage decode portions and row voltage decode portion of the row decoder corresponding to adjacent two blocks in the cell array.

FIG. 7 shows a detailed circuit of the high voltage decode portions 22 corresponding to adjacent two blocks, and low voltage decode portion 23, which the two high voltage decode portions 22 share, in the row decoder. The low voltage decode portion 23 has NM0S transistors N2–N5 serving as a decode gate used for two blocks, and NM0S transistors N6, and N7 serving for selecting one of the two blocks. One end of the transistors N2–N5 is connected to ground potential via an activation NMOS transistor N1, to which an activation signal RDEC is input. Drains of the transistors N6 and N7 are coupled to the power supply node Vdd via activation PMOS transistors P1 and P2, respectively, to which the activation signal RDEC is input.

Drain nodes ND0 and ND1 of the transistors N6 and N7 serve as decode output nodes, respectively, one of which becomes "L" for a selected block. The outputs of the nodes ND0 and ND1 are transferred to the high voltage decode portions 22 via inverters 27 and 28, respectively. The high voltage decode portions 22 are formed of level shifters (LS) 29 and 30 which transfer a high voltage VRDEC output from the high voltage generating circuit to the common gate nodes TG0 and TG1 with level shift operations.

The redundancy system in this embodiment is to replace defective blocks with redundant blocks (not shown) by a block. In the fuse circuits 5a and 5b shown in FIG. 5, a defective address (or addresses) is preliminarily programmed. It will be briefly explained the bock replacement bellow. Replace control circuits 25 and 26 are disposed with fuse data latches in the row decoder shown in FIG. 7. These circuits 25 and 26 control to disable a row decoder corresponding to a bad block address, and activate a redundant row decoder (not shown) when a bad address in input.

As described above, in this embodiment 1, in the row decoder disposed for every two blocks on the same side of the cell array, a common low voltage decode portion is prepared. Therefore, it is possible to reduce the row decoder area.

Embodiment 2

Embodiment 2 will be explained bellow. In this embodiment 2, a low voltage decode portion is disposed as shared by two high voltage decode portions in the row decoder for selecting a block as well as the above-described embodiment 1. In addition to this, in this embodiment 2, the drawing wiring region, which serves for drawing the word lines and coupling those to the row decoder, is improved so that the row decoder is disposed on one side of the cell array. According to this embodiment 2, it becomes possible to lessen more the memory chip area.

Figure 8:
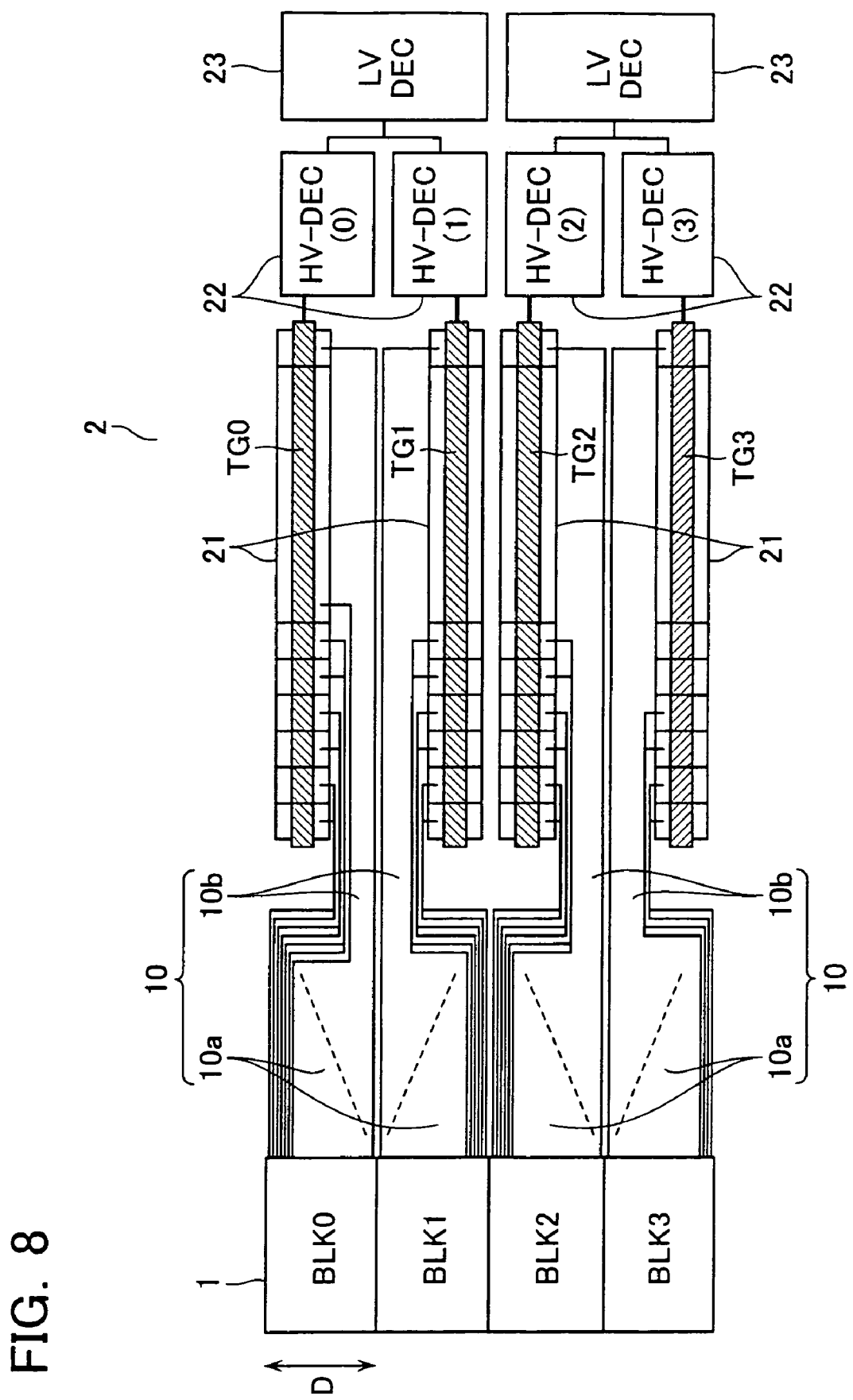
FIG. 8 shows a layout of the word line drawing wiring region.

FIG. 8 shows a schematic layout of a cell array 1 and row decoder 2 of a NAND-type EEPROM in accordance with this embodiment in correspondence to that shown in FIG. 5. As shown in FIG. 8, row decoder 2 is disposed only on one side in the word line direction of the cell array 1. The row decoder 2 has high voltage decode portions 22, which are disposed as correlated with the blocks, and low voltage decode portions 23, which disposed as shared by adjacent two high voltage decode portions correlated with adjacent two blocks, as similar to the embodiment 1.

Each of the transferring transistor arrays 21 is formed within a space with a width "D" of a block BLK, and each of the drawing wiring regions 10 also is formed within the same width because the row decoder 2 is disposed on one side of the cell array 1. In detail, transistor arrays 21 are formed of transferring transistors arranged in the word line direction of the blocks BLK0–BLK3 with common gates TG0–TG3 elongated in the word line direction. Each transferring transistor is formed as channel length direction thereof is in perpendicular to the word line. The high voltage decode portions 22 are disposed as opposed to ends of the common gate TG0–TG3 of the transferring transistor arrays 21, and selectively drive one of the arrays 21.

Each drawing wiring region 10 is formed with the same width as the layout of word lines and select gate lines. This becomes possible as a result of improvement of the drawing wiring structure and the layout of the transferring transistors in the row decoder 2.

In detail, each drawing wiring region 10 is formed of a first region 10a with plural polysilicon wirings arranged with the same pitch as the word lines in the block and as extended portions of the word lines, and a second region 10b, which is a wiring space between adjacent two transistor arrays 21, where such a stacked wiring structure is used that polysilicon wirings are formed of the same film as the word lines and metal wirings are stacked thereabove. The first wiring region 10a has substantially the same wiring space as that of the word lines in a block. Although the wiring space of the second wiring region 10b is smaller than that of the first wiring region 10a because it coexists with the transistor array 21, it is possible to dispose wirings with the same numbers as the first wiring region 10a by use of the stacked wiring structure in part.

Figure 9:
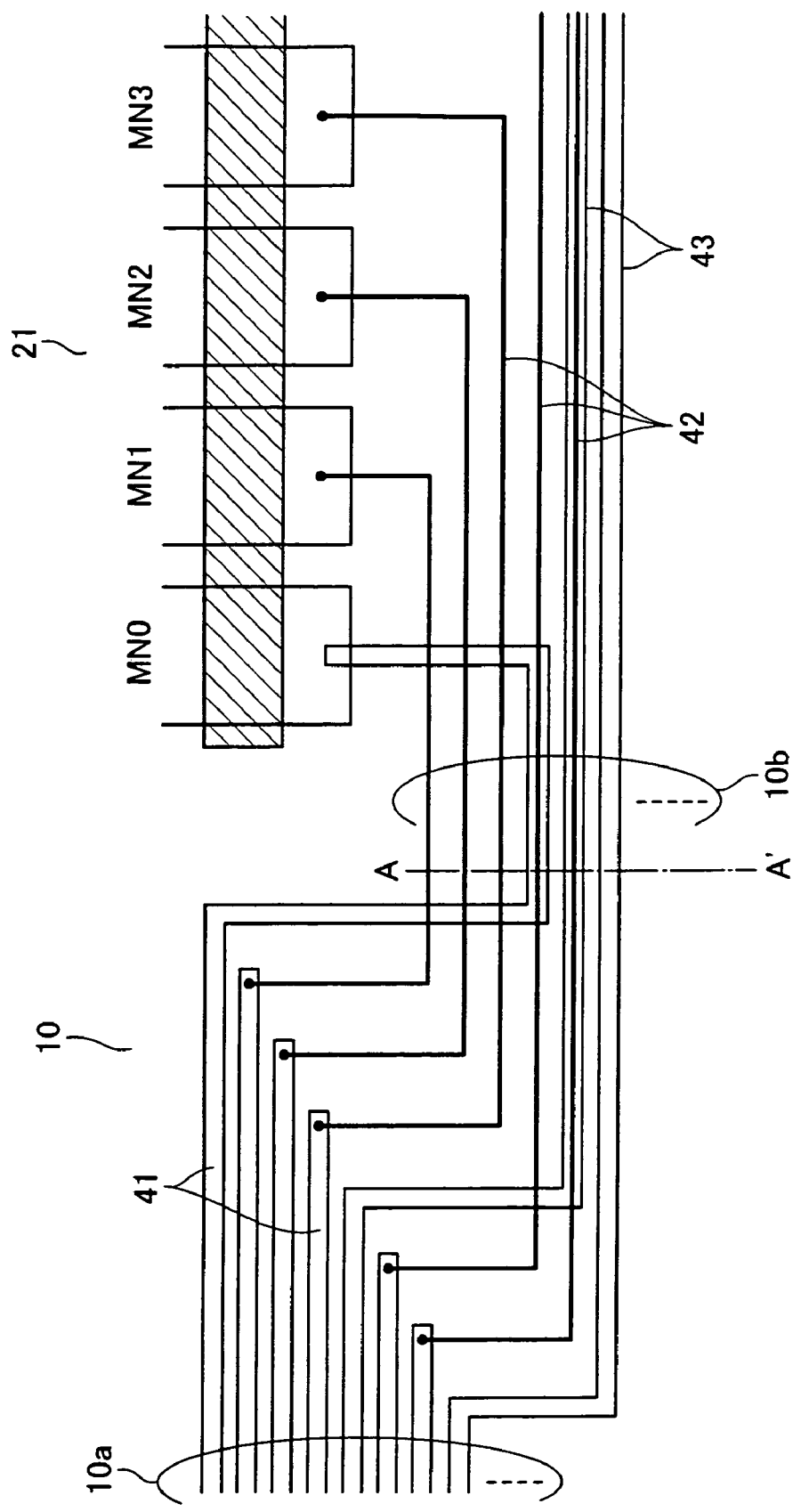
FIG. 9 shows an enlarged layout of the drawing wiring region and transferring transistor array.

FIG. 9 shows an enlarged part of the drawing region 10 and transferring transistor array 21 shown in FIG. 8, especially shows a detailed wiring layout of the drawing wiring region 10. In the first wiring region 10a, polysilicon wirings 41 are formed with the same pitch as the word lines. Some polysilicon wirings in the first wiring region 10a are extended and continued to polysilicon wirings 43 in the second wiring region 10b so as to be contacted to diffusion layers of transferring transistor array 21. The remaining polysilicon wirings in the first wiring region 10a have ends, to which metal wirings 42 (shown by schematic direct lines) in the second wiring region 10b are contacted. The metal wirings 42 are partially stacked above the polysilicon wirings 43 and run in parallel with the polysilicon wirings 43. The remaining portions of the metal wirings 42 are formed without underlying polysilicon wirings.

As described above, by use of the stacked structure of the polysilicon wirings 43 and metal wirings 42 in the second wiring region 10b, it becomes possible to draw the word lines of the blocks from only one side of the cell array 1. In comparison with the case where the word lines are drawn from both sides of the cell array, the memory chip area may be lessened more.

The transistors are arranged in a line in each transferring transistor array 21 in the above-described example. In case there is not such a space that transistors with the same numbers of the word lines and select gate lines are arranged in a line, the transistors may be arranged to constitute two columns. In this case, although wiring portions to be connected to the diffusion layers of these transistors become complicated, wirings to be disposed on the device isolation region of the transistors may be formed of the upper wirings, metal wirings. With this scheme, it becomes sure of device isolation between transistors.

Figure 10:
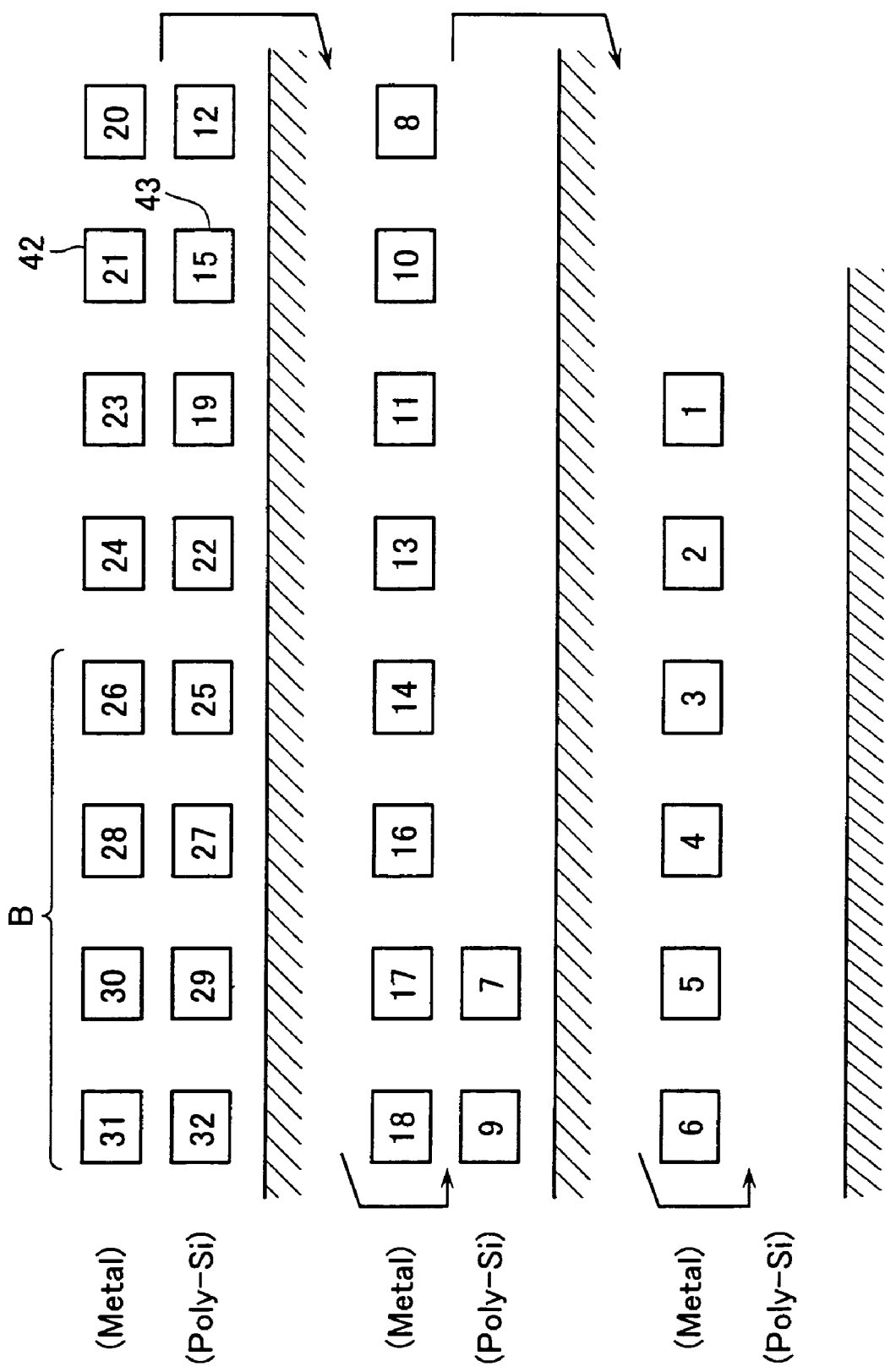
FIG. 10 is a schematic sectional view of the second wiring region (A–A') in FIG. 9.

FIG. 10 shows a schematic cross section of the second wiring region 10b in the drawing wiring region 10 shown in FIG. 9 as taken along line A–A'. In this drawing, one cross section is divided into three portions for the sake of convenience, which continue in practice as shown by arrows. Wirings are shown by squares, in which numbers are written in accordance with the arranging order of word lines in a block with thirty two word lines. As shown in FIG. 10, the wiring region 10b has portions where only metal wirings 42 are formed and other portions where polysilicon wirings 43 and metal wirings 42 are stacked. Usually, a coupling capacitance between the upper metal wiring 42 and the lower polysilicon wiring 43 is larger than that between wirings laterally opposed to each other. Therefore, it is preferable that two wirings corresponding to adjacent two word lines are disposed as not stacked in this second wiring region 10b. Especially, it is required to consider the word line voltage relationship in a write mode.

For example, to boost non-selected (i.e., unselected) cell's channels for write-inhibiting the unselected cells at data write time, self-boost scheme and local self-boost scheme are used. In the former scheme, a selected word line is applied with a write voltage Vpgm; and unselected word lines are applied with write pass voltage Vpass. With this voltage application, the channels of unselected cells are boosted in potential so that electron injection does not occur. In the latter scheme, to boost the unselected cell's channel more. effectively, an unselected word line adjacent to the selected word line is applied with 0V.

In the local self-boost scheme, electric field between adjacent two word lines becomes sometimes larger than that in the self-boost scheme, and there is a fear of erroneous write due to the electric field between the adjacent word lines. In the area, B, of the wiring structure shown in FIG. 10, two wirings corresponding to two adjacent word lines are stacked. Even if this is allowable in the self-boost scheme, it is not preferable in the case the local self-boost scheme is adapted.

Figure 11:
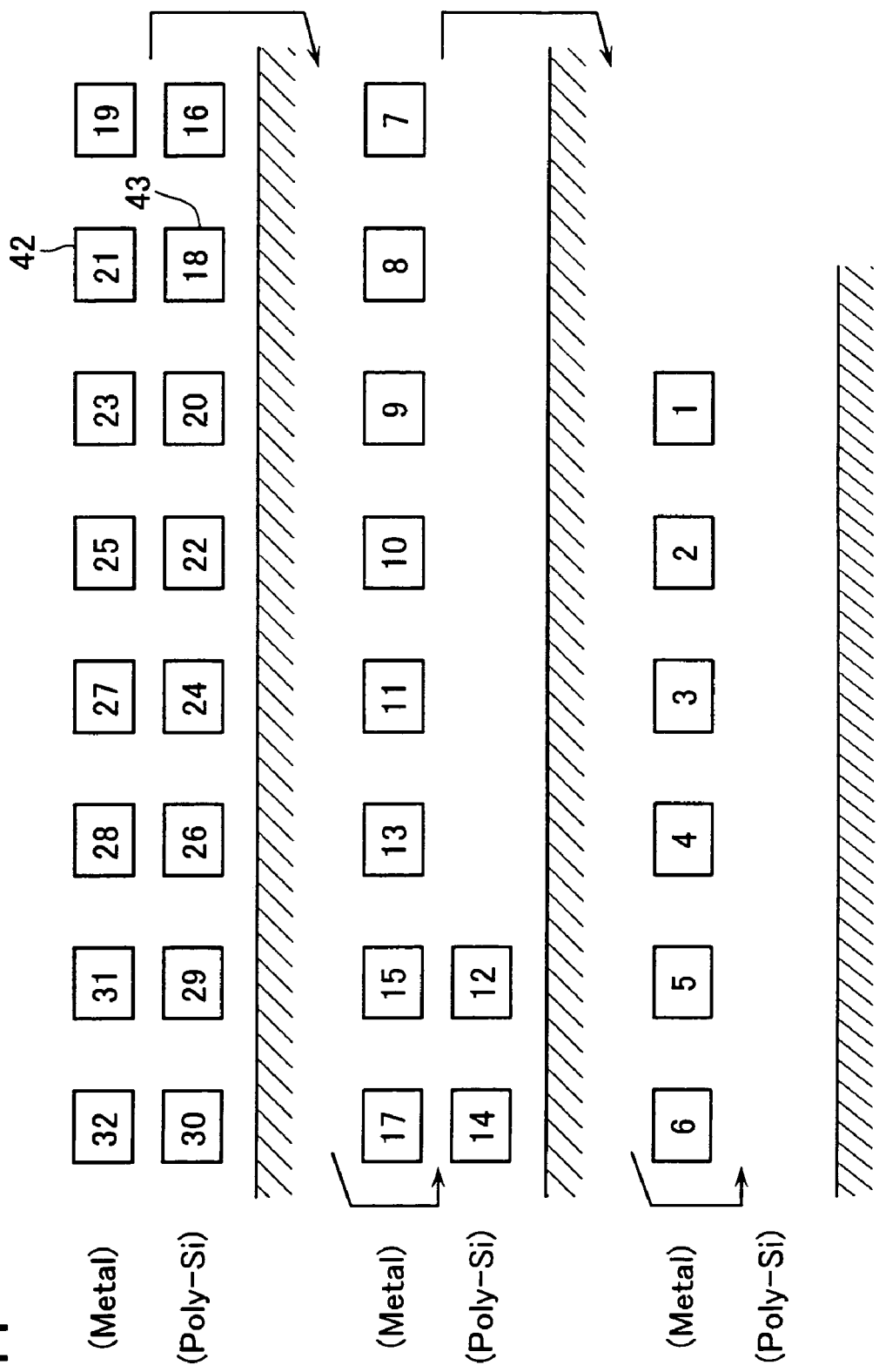
FIG. 11 is another schematic sectional view of the second wiring region (A–A') in FIG. 9.

FIG. 11 shows a case that two wirings corresponding to two adjacent word lines are disposed as not stacked in the second wiring region 10b. In case the local self-boost scheme is used, this wiring structure is preferable. This wiring structure may be easily achieved by designing the wiring connection relationships between the first wiring region 10a and the second wiring region 10b.

Embodiment 3

In the above-described embodiments, only one cell array is prepared. In case of applying the NAND-type EEPROM to an electric card and the like, it is preferable to change the cell array numbers (i.e., plane numbers) so as to change the memory capacity without changing the specification of a block serving as a unit of data erase.

Figure 12:
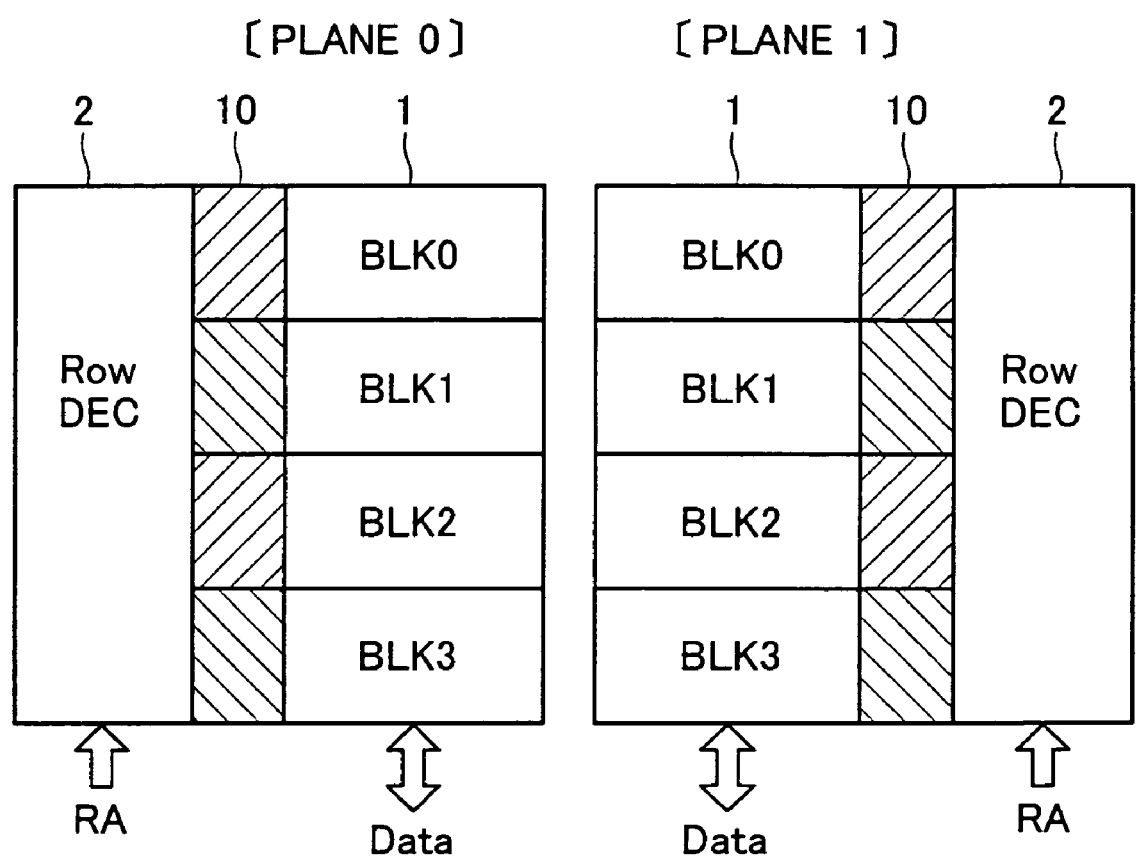
FIG. 12 shows another embodiment applied to a memory with two cell array planes.

FIG. 12 shows a main portion of an embodiment with two cell arrays to which the scheme of the embodiment 2 is adapted. Two memory planes, PLANE0 and PLANE1, are disposed with a symmetrical pattern in such a manner that two cell arrays 1 are disposed as opposed to each other in the word line direction, and row decoders 2 are disposed on the opposite sides of a space including two cell arrays 1 so as to sandwich the two cell arrays 1. That is, in PLANE0, row decoder 2 is disposed on the left side of the cell array with drawing wiring region 10 interposed therebetween; and in PLANE1, row decoder 2 is disposed on the right side of the cell array 1 with drawing wiring region 10 interposed therebetween.

By use of such the symmetrical pattern, it is easy to increase the memory capacitance with changing the memory design little. If necessary for increasing the cell array numbers to three or more, it will be easily possible by repeat of the layout.

Embodiment 4

As an embodiment, an electric card using the non-volatile semiconductor memory devices according to the above-described embodiments 1–3 of the present invention and an electric device using the card will be described bellow.

Figure 13:
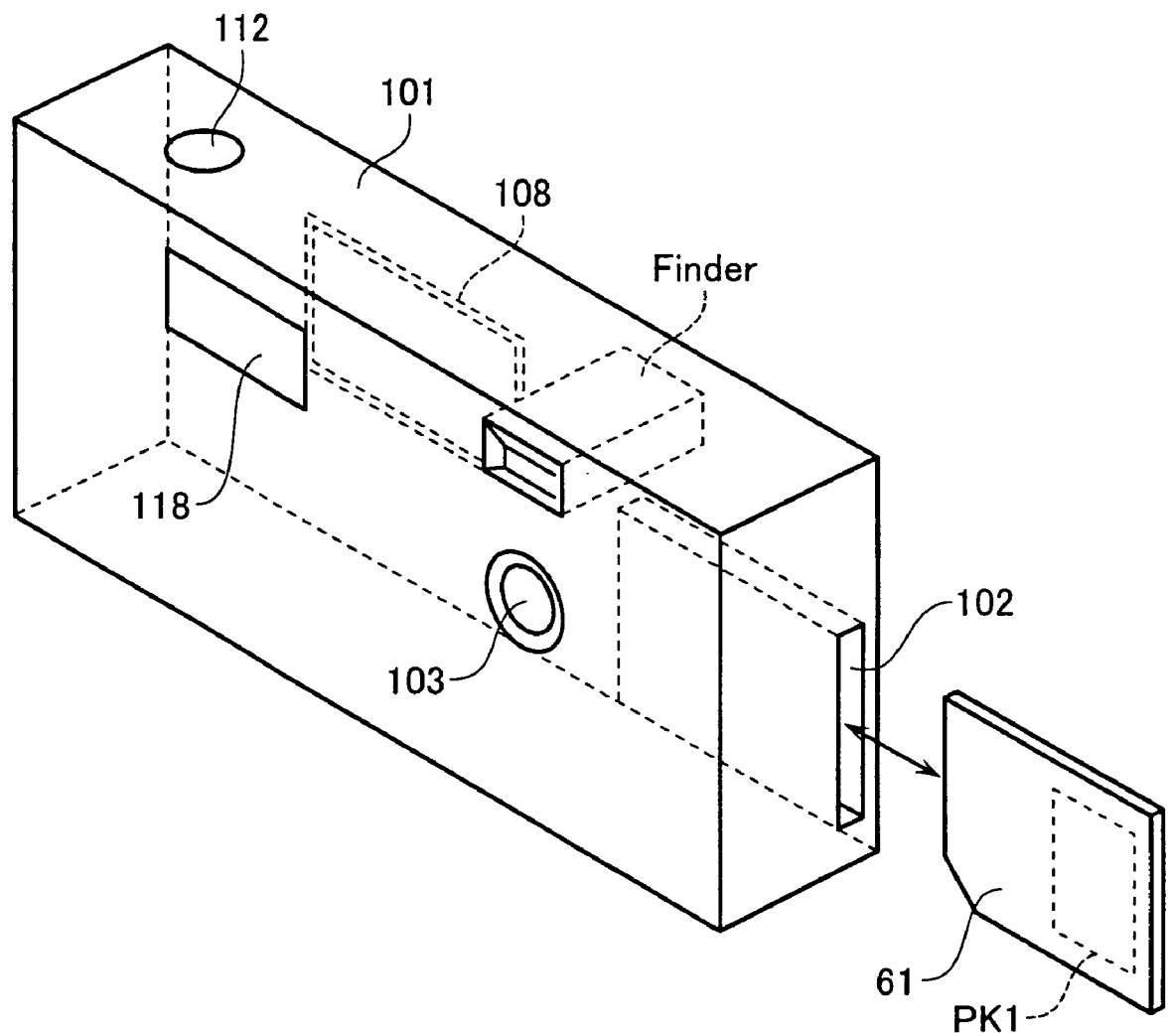
FIG. 13 shows another embodiment applied to a digital still camera.

FIG. 13 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 14:
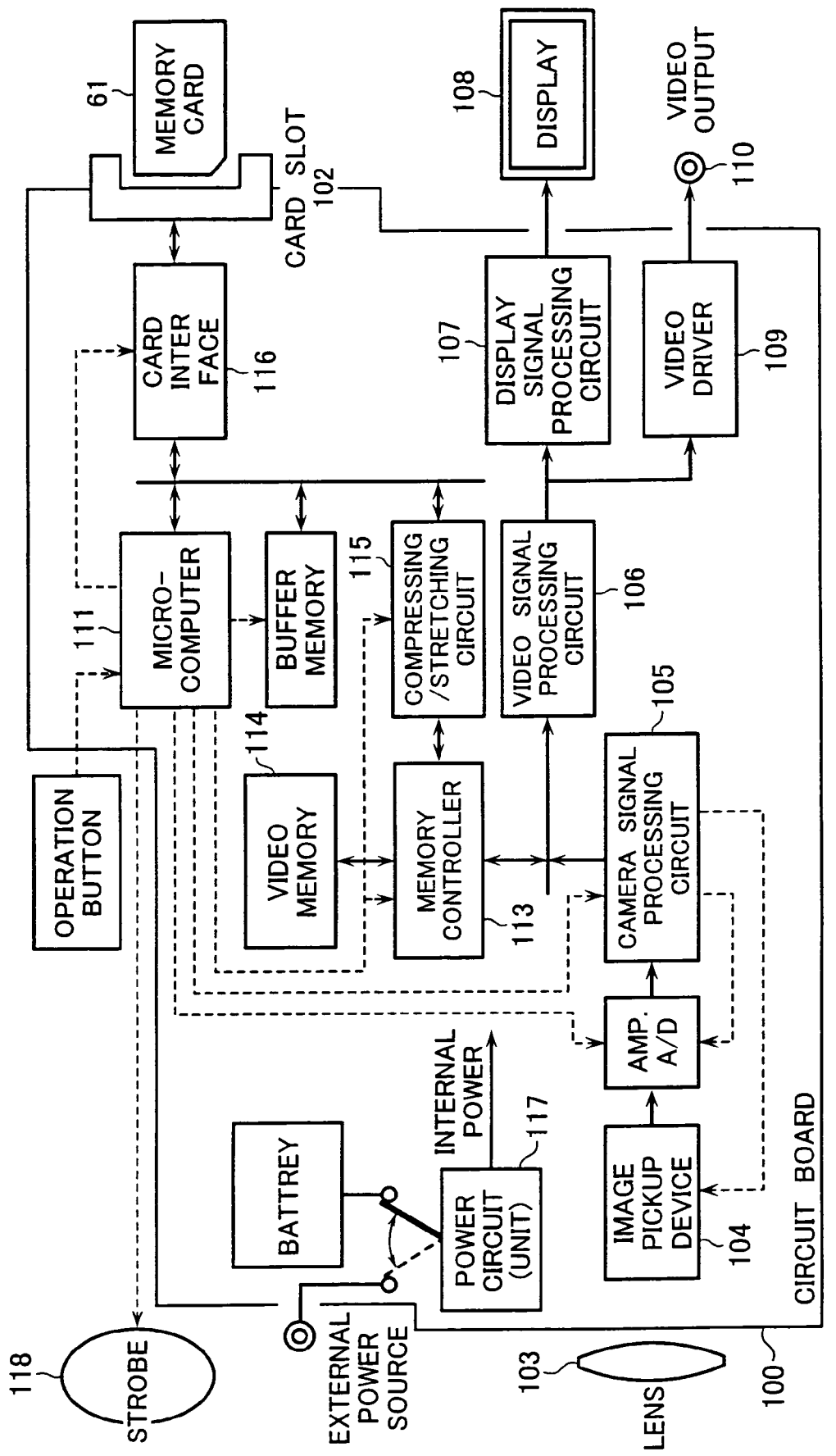
FIG. 14 shows the internal configuration of the digital still camera.
Figure 15A:
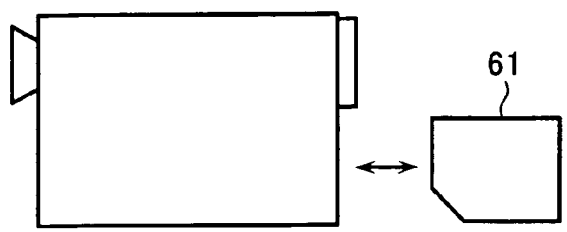
FIGS. 15A to 15J show other electric devices to which the embodiment is applied.
Figure 15F:
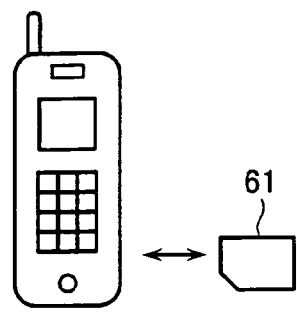
Figure 15B:
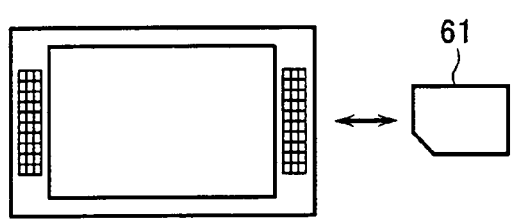
Figure 15G:
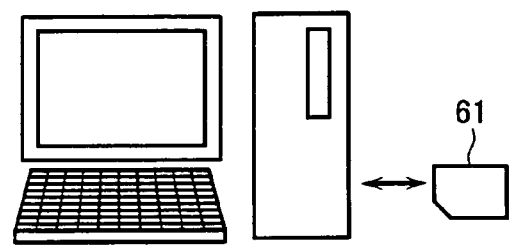
Figure 15C:
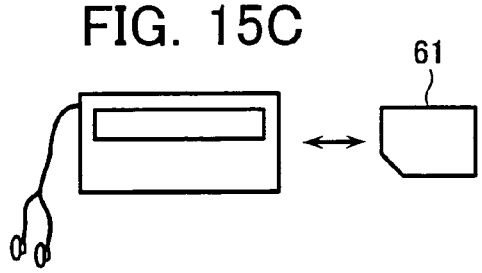
Figure 15H:
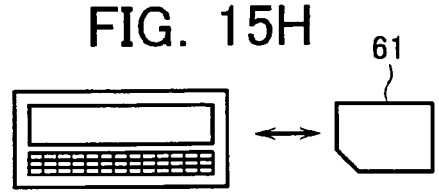
Figure 15D:
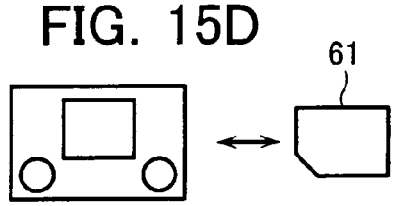
Figure 15I:
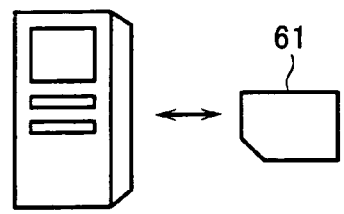
Figure 15E:
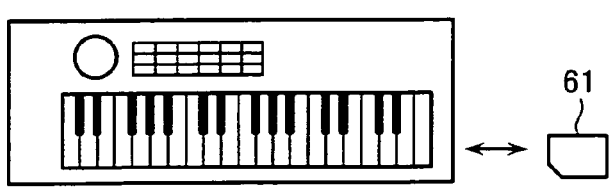
Figure 15J:
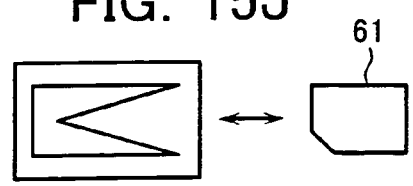

FIG. 14 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC—DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 15A to 15J, as well as in portable electric devices. That is, the electric card can also be used in a video camera shown in FIG. 15A, a television set shown in FIG. 15B, an audio apparatus shown in FIG. 15C, a game apparatus shown in FIG. 15D, an electric musical instrument shown in FIG. 15E, a cell phone shown in FIG. 15F, a personal computer shown in FIG. 15G, a personal digital assistant (PDA) shown in FIG. 15H, a voice recorder shown in FIG. 15I, and a PC card shown in FIG. 15J.

This invention is not limited to the above-described embodiment. It will be understood by those skilled in the art that various changes in form and detail may be made without departing from the spirit, scope, and teaching of the invention.

What is claimed is:

1. A semiconductor memory device comprising:
    a cell array including bit lines and word lines disposed to cross each other, and electrically rewritable and non-volatile memory cells disposed at crossings of the bit lines and word lines, plural of said memory cells being connected in series to constitute a NAND cell unit, plural blocks being arranged in the bit line direction, each block being constituted by plural NAND cell units arranged in the word line direction; and
    a row decoder configured to select a block of said cell array, wherein
    said row decoder comprises:
    transferring transistor arrays disposed in association with the blocks, in each of which transistors are arranged for transferring word line drive voltages;
    first decode portions disposed in association with said transferring transistor arrays, which are applied with boosted voltages to selectively drive said transferring transistor arrays; and
    second decode portions configured to select one of the blocks, each of which is disposed to be shared by adjacent two first decode portions.

2. The semiconductor memory device according to claim 1, wherein
    said cell array includes at least four blocks arranged in the bit line direction, and wherein
    a first row decoder is disposed on one side in the word line direction of said cell array for selecting first and second blocks which are adjacent to each other; and
    a second row decoder is disposed on the other side in the word line direction of said cell array for selecting third and fourth blocks which are adjacent to each other.

3. The semiconductor memory device according to claim 2, wherein
    the word lines in the blocks are drawn and connected to the transistors in said transferring transistor arrays respectively with wiring pitch change in the respective drawing wiring regions.

4. The semiconductor memory device according to claim 1, wherein said row decoder is disposed on one side of said cell array in the word line direction.

5. The semiconductor memory device according to claim 4,
    wherein each said transferring transistor array is formed of plural transistors arranged in the word line direction, the channel length direction of each transistor being defined to be in perpendicular to the word line.

6. The semiconductor memory device according to claim 5, further comprising drawing wiring regions for drawing the word lines in the blocks and coupling those to the transistors in said transferring transistor arrays respectively, wherein each said drawing wiring region comprises:
   a first wiring region with first polysilicon wirings formed as extending portions of the word lines with the same pitch as the word lines; and
   a second wiring region with second polysilicon wirings and metal wirings, the second polysilicon wirings being formed of and extended from some first polysilicon wirings for coupling those to diffusion layers of said transferring transistor array, the metal wirings being formed as partially stacked above the second polysilicon wiring for coupling the remaining first polysilicon wirings to diffusion layers of said transferring transistor array.

7. The semiconductor memory device according to claim 6, wherein the first wiring region has substantially the same width as the block; and
   the second wiring region has a width smaller than that of the first wiring region.

8. The semiconductor memory device according to claim 6, wherein wiring connection relationships between the first and second wiring regions are designed in such a manner that two wirings corresponding to adjacent two word lines are not stacked each other in the second wiring region.

9. The semiconductor memory device according to claim 4, wherein two cell arrays are disposed as opposed to each other in the word line direction, and
   two row decoders are so disposed as to sandwich said two cell arrays.

10. An electric card equipped with the semiconductor memory device defined in claim 1.

11. An electric device comprising:
   a card interface;
   a card slot connected to said card interface; and
   said electric card defined in claim 10 and electrically connectable to said the card slot.

12. The electric device according to claim 11, wherein said electric device is a digital still camera.

13. The semiconductor memory device according to claim 1,
   wherein each transferring transistor array has transistors arranged in the word line direction for transferring word line drive voltages to a block.

14. The semiconductor memory device according to claim 13, wherein said row decoder further comprises:
   first decode portions disposed in association with said transferring transistor arrays, each of which is applied with boosted voltages to selectively drive said transferring transistor arrays; and
   second decode portions configured to select one of the blocks, each of which is disposed to be shared by adjacent two first decode portions.

15. The semiconductor memory device according to claim 13, wherein said row decoder further comprises
   drawing wiring regions having wirings with stacked structures in part for drawing the word lines in the blocks and coupling those to the transistors in said transferring transistor arrays.

16. The semiconductor memory device according to claim 14, wherein
   each said transferring transistor arrays has transistors with a common gate elongated in the word line direction, and wherein
   the first decode portions are disposed as opposed to ends of the common gates of said transferring transistor arrays.

17. The semiconductor memory device according to claim 15, wherein each said drawing wiring region comprises:
   a first wiring region with first polysilicon wirings formed as extending portions of the word lines with the same pitch as the word lines; and
   a second wiring region with second polysilicon wirings and metal wirings, the second polysilicon wirings being formed of and extended from some first polysilicon wirings for coupling those to diffusion layers of said transferring transistor array, the metal wirings being formed as partially stacked above the second polysilicon wiring for coupling the remaining first polysilicon wirings to diffusion layers of said transferring transistor array.

18. The semiconductor memory device according to claim 17, wherein the first wiring region has substantially the same width as the block; and
   the second wiring region has a width smaller than that of the first wiring region.

19. The semiconductor memory device according to claim 17, wherein wiring connection relationships between the first and second wiring regions are designed in such a manner that two wirings corresponding to adjacent two word lines are not stacked each other in the second wiring region.

20. An electric card equipped with a semiconductor memory device defined in claim 13.

* * * * *